(12) United States Patent
Baek

(10) Patent No.: US 11,594,701 B2
(45) Date of Patent: Feb. 28, 2023

(54) ELECTROLUMINESCENT DISPLAY DEVICE AND METHOD OF MANUFACTURING THE SAME

(71) Applicant: LG Display Co., Ltd., Seoul (KR)

(72) Inventor: Heume-Il Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 122 days.

(21) Appl. No.: 17/108,948

(22) Filed: Dec. 1, 2020

(65) Prior Publication Data

US 2021/0175460 A1 Jun. 10, 2021

(30) Foreign Application Priority Data

Dec. 6, 2019 (KR) .................... 10-2019-0161471

(51) Int. Cl.
*H01L 51/52* (2006.01)
*H01L 51/56* (2006.01)
*H01L 27/32* (2006.01)

(52) U.S. Cl.
CPC ...... *H01L 51/5228* (2013.01); *H01L 27/3246* (2013.01); *H01L 27/3279* (2013.01); *H01L 51/56* (2013.01); *H01L 27/3211* (2013.01); *H01L 2227/323* (2013.01)

(58) Field of Classification Search
CPC .................... H01L 51/5228; H01L 27/3246
See application file for complete search history.

(56) References Cited

U.S. PATENT DOCUMENTS

| | | | |
|---|---|---|---|
| 9,991,464 B2 | 6/2018 | Lee et al. |
| 10,367,046 B2 | 7/2019 | Lee et al. |
| 10,431,768 B2 | 10/2019 | Lee et al. |
| 2015/0179719 A1* | 6/2015 | Nam | H01L 27/3258 438/4 |
| 2018/0006264 A1 | 1/2018 | Lee et al. |
| 2018/0122882 A1 | 5/2018 | Lee et al. |
| 2018/0254429 A1 | 9/2018 | Lee et al. |

FOREIGN PATENT DOCUMENTS

| | | |
|---|---|---|
| CN | 107565041 A | 1/2018 |
| CN | 108122944 A | 6/2018 |

OTHER PUBLICATIONS

Taiwan Intellectual Property Administration, Office Action, TW Patent Application No. 109141878, dated Oct. 20, 2021, ten pages.
European Patent Office, Extended European Search Report and Opinion, EP Patent Application No. 20211892.3, dated Apr. 21, 2021, seven pages.

* cited by examiner

*Primary Examiner* — Fernando L Toledo
*Assistant Examiner* — Valerie N Newton
(74) *Attorney, Agent, or Firm* — Fenwick & West LLP

(57) ABSTRACT

An electroluminescent display device comprises a substrate, a first electrode on the substrate, a connection pattern on the substrate and spaced apart from the first electrode, a bank covering edges of the first electrode and the connection pattern, a light-emitting layer on the first electrode, and a second electrode on the light-emitting layer, the bank and the connection pattern, wherein the connection pattern includes at least one protrusion part and a flat part, and wherein each of the first electrode and the connection pattern includes a first layer and a second layer, the second layer is disposed between the substrate and the first layer, and the second layer of the connection pattern has the at least one protrusion part.

16 Claims, 12 Drawing Sheets

ELECTROLUMINESCENT DISPLAY DEVICE AND METHOD OF MANUFACTURING THE SAME

CROSS-REFERENCE TO RELATED APPLICATIONS

The present application claims priority from and the benefit under 35 U.S.C. § 119(a) of Republic of Korea Patent Application No. 10-2019-0161471 filed on Dec. 6, 2019, which is hereby incorporated by reference in its entirety.

BACKGROUND

Field of the Disclosure

The present disclosure relates to an electroluminescent display device, and more particularly, to an electroluminescent display device having a large size and high definition and a method of manufacturing the same.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green, and blue sub-pixels, and displays various color images by allowing the red, green, and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device and a method of manufacturing the same that substantially obviate one or more of the problems due to limitations and disadvantages of the related art.

An object of the present disclosure is to provide an electroluminescent display device having a large size and high definition and a method of manufacturing the same.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate, a first electrode on the substrate, a connection pattern on the substrate and spaced apart from the first electrode, a bank covering edges of the first electrode and the connection pattern, a light-emitting layer on the first electrode, and a second electrode on the light-emitting layer, the bank and the connection pattern, wherein the connection pattern includes at least one protrusion part and a flat part, and wherein each of the first electrode and the connection pattern includes a first layer and a second layer, the second layer is disposed between the substrate and the first layer, and the second layer of the connection pattern has the at least one protrusion part.

In another aspect, a method of manufacturing an electroluminescent display device comprises forming a first electrode and a connection pattern on a substrate, forming a bank on the first electrode and the connection pattern; forming a light-emitting layer on the first electrode, and forming a second electrode on the light-emitting layer, the bank and the connection pattern, wherein the connection pattern includes at least one protrusion part and a flat part, and wherein each of the first electrode and the connection pattern includes a first layer and a second layer, the second layer is disposed between the substrate and the first layer, and the second layer of the connection pattern has the at least one protrusion part.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION

Reference will now be made in detail to an exemplary embodiment of the disclosure, examples of which are illustrated in the accompanying drawings.

An electroluminescent display device according to an embodiment of the present disclosure includes a plurality of pixels to display an image, and each of the plurality of pixels includes red, green, and blue sub-pixels. A pixel region corresponding to each sub-pixel can have a configuration shown in FIG. 1.

Figure 1:
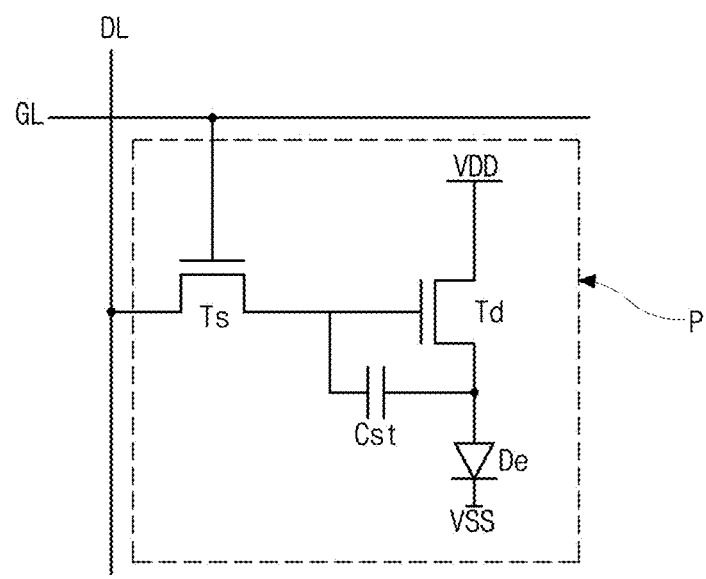
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
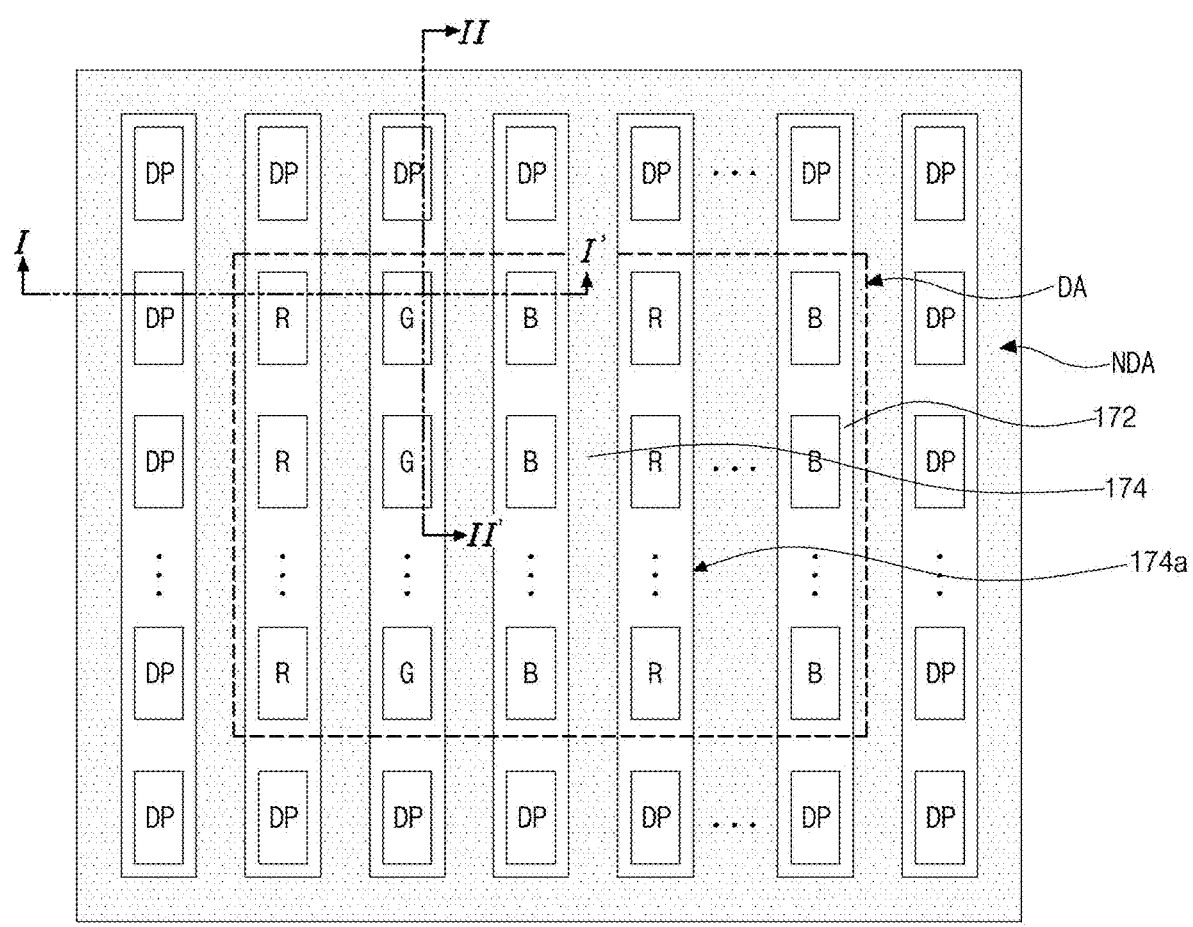
FIG. 2 is a schematic plan view of an electroluminescent display device according to an embodiment of the present disclosure.

FIG. 2 is a schematic plan view of an electroluminescent display device according to an embodiment of the present disclosure and mainly shows a bank configuration.

In FIG. 2, the electroluminescent display device according to the embodiment of the present disclosure includes a display area DA displaying an image and a non-display area NDA surrounding the display area DA.

In the display area DA, red, green, and blue sub-pixels R, G and B are disposed. The red, green, and blue sub-pixels R, G and B are sequentially arranged along a first direction, and the same color sub-pixels R, G, and B are arranged along a second direction. For example, R, G and B sub-pixels are repeatedly arranged in that order along the first direction (e.g., horizontal direction), whereas a column of R sub-pixels, a column of G sub-pixels, and a column of B sub-pixels are repeatedly arranged in that order along the second direction (e.g., vertical direction). Here, the red, green, and blue sub-pixels R, G and B are shown to each have a rectangular shape, but is not limited thereto. The red, green, and blue sub-pixels R, G and B each can have various shapes such as a rectangular shape with rounded corners, an oval shape, or the like.

In the non-display area NDA, a plurality of dummy sub-pixels DP are disposed. It is illustrated that one dummy sub-pixel DP is disposed at each of left and right sides of each sub-pixel row of the first direction and upper and lower sides of each sub-pixel column of the second direction in the display area DA, the number of the dummy sub-pixel DP is not limited thereto. For example, two or more dummy sub-pixels DP can be disposed at each of the left and right sides of each sub-pixel row, and two or more dummy sub-pixels DP can be disposed at each of the upper and lower sides of each sub-pixel column.

A bank is disposed to correspond to the sub-pixels R, G, and B of the display area DA and the dummy sub-pixels DP of the non-display area NDA. The bank includes a first bank 172 of a hydrophilic property and a second bank 174 of a hydrophobic property.

More specifically, the first bank 172 is disposed between adjacent same color sub-pixels R, G, and B and between adjacent different color sub-pixels R, G and B in the display area DA. The first bank 172 can surround each sub-pixel R, G, and B.

Alternatively, the first bank 172 can be omitted between the adjacent different color sub-pixels R, G and B. That is, the first bank 172 can be formed between the adjacent sub-pixels R, G and B along the second direction and can extend along the first direction.

The second bank 174 is disposed on the first bank 172. The second bank 174 has an opening 174a corresponding to a same color sub-pixel column and is disposed between adjacent different color sub-pixels R, G and B. The opening 174a can extend into the dummy sub-pixel DP adjacent to the same color sub-pixel column along the second direction.

In addition, the opening 174a is also formed to correspond to a dummy sub-pixel column along the second direction.

Accordingly, the opening 174a extends in the second direction, and the opening 174a has a length of the second direction longer than a length of the first direction. That is, the opening 174a has a short side parallel to the first direction and a long side parallel to the second direction. At this time, the second bank 174 can have a narrower width than the first bank 172 between adjacent different color sub-pixels R, G and B.

A cross-sectional structure of the electroluminescent display device according to the embodiment of the present disclosure will be described with reference to FIG. 3 and FIG. 4.

Figure 3:
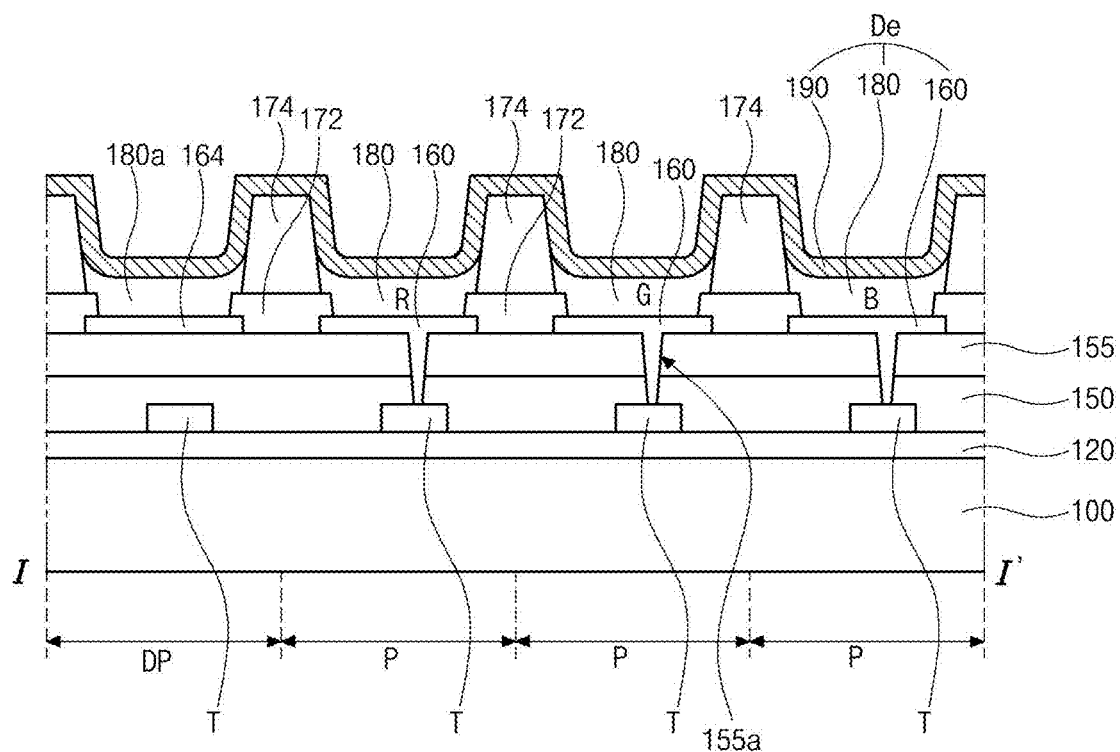
FIG. 3 is a cross-sectional view corresponding to the line I-I' of FIG. 2 according to an embodiment of the present disclosure.
Figure 4:
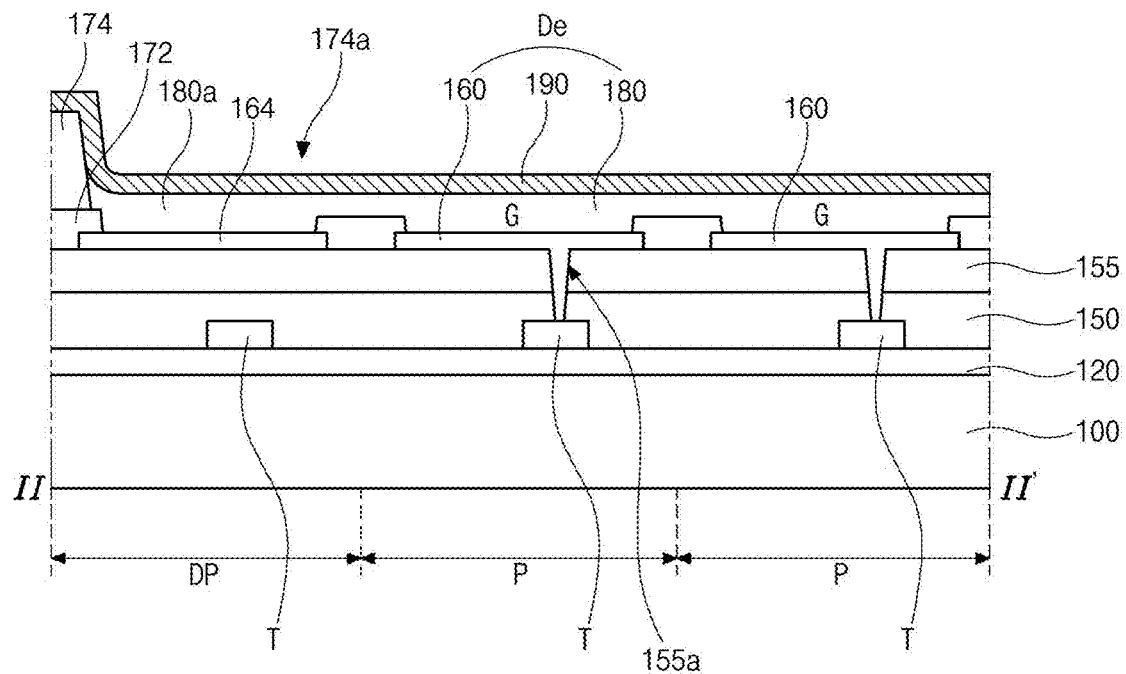
FIG. 4 is a cross-sectional view corresponding to the line II-II' of FIG. 2 according to an embodiment of the present disclosure.

FIG. 3 is a cross-sectional view corresponding to the line I-I' of FIG. 2, and FIG. 4 is a cross-sectional view corresponding to the line II-II' of FIG. 2 according to embodiments of the present disclosure.

In FIG. 3 and FIG. 4, a plurality of pixel regions P respectively corresponding to red, green and blue sub-pixels R, G and B and a dummy sub-pixel region DP are defined on a substrate 100, and a buffer layer 120, thin film transistors T, a passivation layer 150 and an overcoat layer 155 are sequentially formed on the substrate 100.

Here, the thin film transistor T includes a gate electrode, a semiconductor layer, and source and drain electrodes, and this will be described in detail later.

Although not shown in the figure, one or more insulation layers can be further formed between the buffer layer 120 and the passivation layer 150.

In each pixel region P, the overcoat layer 155 has a drain contact hole 155a exposing a part of the thin film transistor T, that is, a drain electrode together with the passivation layer 150.

A first electrode 160 is formed in each pixel region P on the overcoat layer 155, and a dummy electrode 164 is formed in the dummy sub-pixel region DP on the overcoat layer 155. The first electrode 160 contacts the drain electrode of the thin film transistor T through the drain contact hole 155a.

On the other hand, the passivation layer 150 and the overcoat layer 155 do not have a drain contact hole in the dummy sub-pixel region DP, and the dummy electrode 164 is not connected to the thin film transistor T in the dummy sub-pixel region DP.

Meanwhile, the dummy electrode 164 and the thin film transistor T in the dummy sub-pixel region DP are formed such that a top surface in the dummy sub-pixel region DP may be substantially flush with that in the pixel region P. At least one of the dummy electrode 164 and the thin film transistor T can be omitted in the dummy sub-pixel region DP.

A first bank 172 of a hydrophilic property is formed on the first electrode 160 and the dummy electrode 164. The first bank 172 overlaps and covers edges of the first electrode 160 of the pixel region P. The first bank 172 is formed between adjacent same color sub-pixels R, G and B and between adjacent different color sub-pixels R, G and B. Alternatively, the first bank 172 can be omitted between adjacent different color sub-pixels R, G and B and can be disposed only between adjacent same color sub-pixels R, G and B.

In addition, the first bank 172 overlaps and covers edges of the dummy electrode 164 of the dummy sub-pixel region DP.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

A second bank 174 of a hydrophobic property is formed on the first bank 172. The second bank 174 has a thicker thickness than the first bank 172. The second bank 174 may be formed only between adjacent different color sub-pixels R, G and B and is not formed between adjacent same color sub-pixels R, G and B. A width of the second bank 174 is narrower than a width of the first bank 172 between adjacent different color sub-pixels R, G and B.

The second bank 174 has an opening 174a corresponding to a same color sub-pixel column and exposes the first electrodes 162 of the same color sub-pixel column and the first bank 172 between adjacent first electrodes 162 through the opening 174a. In addition, the opening 174a extends into the dummy sub-pixel region DP adjacent to the same color sub-pixel row, and the dummy electrode 164 is exposed through the opening 174a.

Here, when the first bank 172 is omitted between adjacent different color sub-pixels R, G and B, the second bank 174 contacts and overlaps edges of each first electrode 160 of FIG. 3 and covers the edges of each first electrode 160 of FIG. 3.

The second bank 174 can be formed of an organic insulating material having a hydrophobic property. Alternatively, the second bank 174 can be formed of an organic insulating material having a hydrophilic property and can be subjected to a hydrophobic treatment.

The first bank 172 and the second bank 174 can be formed of the same material and formed as one body. At this time, the first bank 172 and the second bank 174 can be formed through a half-tone mask process.

A light-emitting layer 180 is formed on the first electrode 160 exposed through the opening 174a of the second bank 174 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 174a of the second bank 174 between adjacent same color sub-pixels R, G and B. Namely, in FIG. 4, the green light-emitting layer 180 is also formed on the first bank 172 exposed through the opening 174a of the second bank 174 between adjacent green sub-pixels G. At this time, the light-emitting layer 180 on the first bank 172 is connected to the light-emitting layer 180 on the first electrode 160 in each pixel region P adjacent thereto to thereby form one body.

A dummy light-emitting layer 180a is formed on the dummy electrode 164 in the dummy sub-pixel region DP. Referring to FIG. 3, the dummy light-emitting layer 180a of the dummy sub-pixel region DP is spaced apart from the light-emitting layer 180 of the pixel region P adjacent thereto along the first direction, and referring to FIG. 4, the dummy light-emitting layer 180a of the dummy sub-pixel region DP is connected to the light-emitting layer 180 of the pixel region P adjacent thereto along the second direction to thereby form one body.

The light-emitting layer 180 is formed through a solution process. Here, the solutions dropped into respective pixel regions P corresponding to the same color sub-pixels, for example, the green sub-pixel column through different nozzles are connected to each other, and the light-emitting layer 180 is formed by drying the solutions. Accordingly, a deviation in the dropping amounts between the nozzles is minimized, and thicknesses of the light-emitting layers 180 can be uniform in the respective pixel regions P. At this time, the dummy light-emitting layer 180a is formed simultaneously with the light-emitting layer 180.

Heights of the light-emitting layer 180 and the dummy light-emitting layer 180a formed through the solution process rise around the second bank 174 as it gets closer to the second bank 174.

Next, a second electrode 190 is formed on the light-emitting layer 180 and the dummy light-emitting layer 180a. The second electrode 190 is also formed on a top surface and a side surface of the second bank 174.

The first electrode 160, the light-emitting layer 180, and the second electrode 190 constitute a light-emitting diode De.

The electroluminescent display device according to the embodiment of the present disclosure is a top emission type in which light of a light-emitting diode De is output toward a direction opposite the substrate 100, that is, output to the outside through the second electrode 190. The top emission type display device can have a wider emission area than a bottom emission type display device of the same size, to thereby improve luminance and reduce power consumption.

To transmit light, the second electrode 190 can be formed of a metal material so as to have a thin thickness or formed of a transparent conductive material. Accordingly, the resistance of the second electrode 190 increases, and a voltage drop occurs due to the resistance, thereby causing a problem of non-uniform brightness.

In the present disclosure, to lower the resistance of the second electrode 190, the second electrode 190 is electrically connected to an auxiliary electrode. At this time, the second electrode 190 and the auxiliary electrode are electrically connected through a connection pattern, and to improve an electrical contact property between the connection pattern and the second electrode 190, a protrusion part is formed in the connection pattern.

The configuration of the electroluminescent display device according to the embodiment of the present disclosure will be described with reference to FIGS. 5 to 7.

Figure 5:
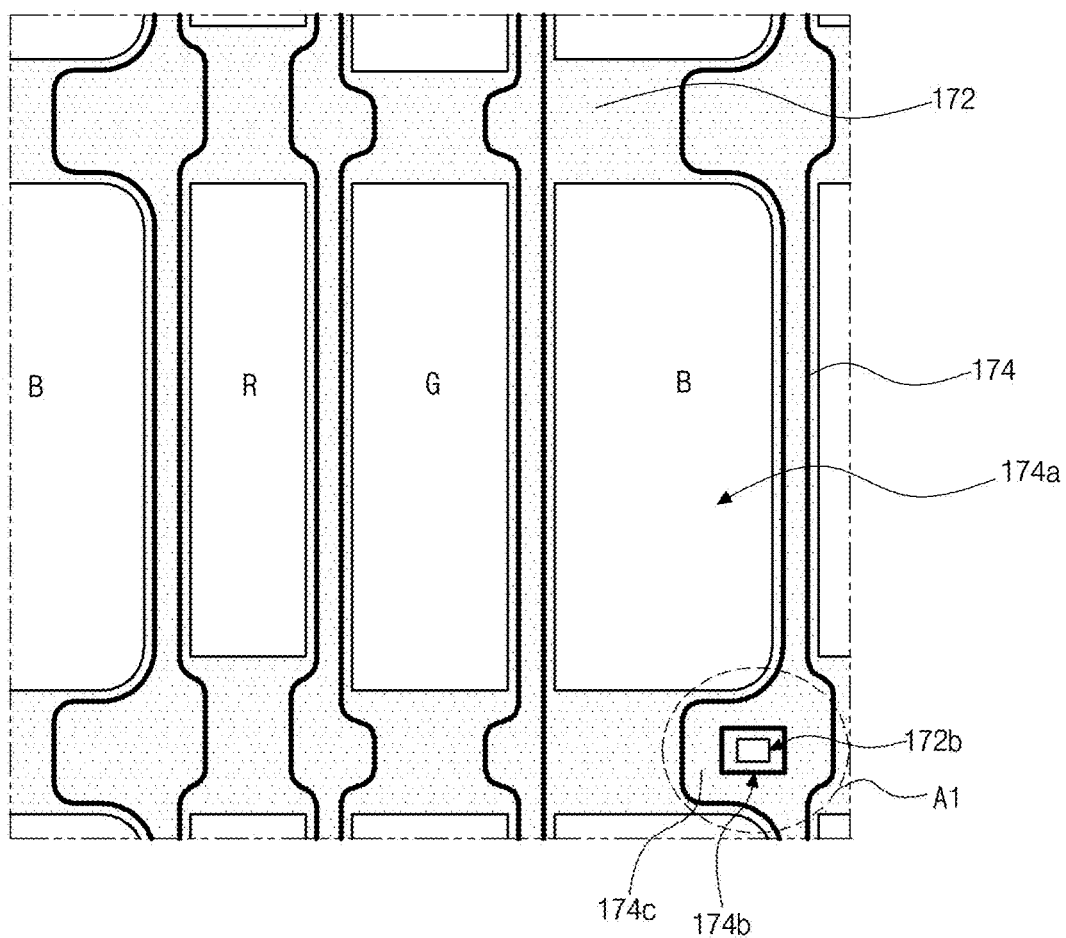
FIG. 5 is a schematic plan view of a pixel of an electroluminescent display device according to an embodiment of the present disclosure.

FIG. 5 is a schematic plan view of a pixel of an electroluminescent display device according to an embodiment of the present disclosure and mainly shows a bank configuration. FIG. 6 and FIG. 7 are plan views of enlarging an area A1 of FIG. 5 according to embodiments of the present disclosure.

Figure 6:
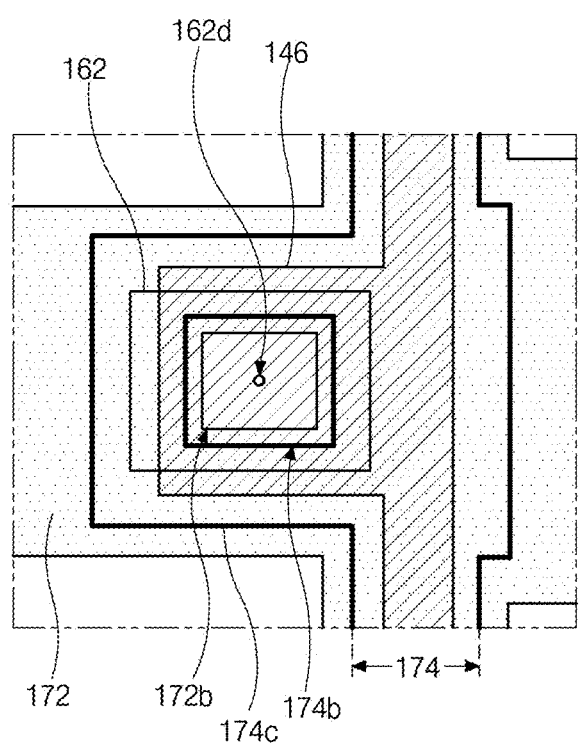
FIG. 6 and FIG. 7 are plan views of enlarging an area A1 of FIG. 5 according to embodiments of the present disclosure.
Figure 7:
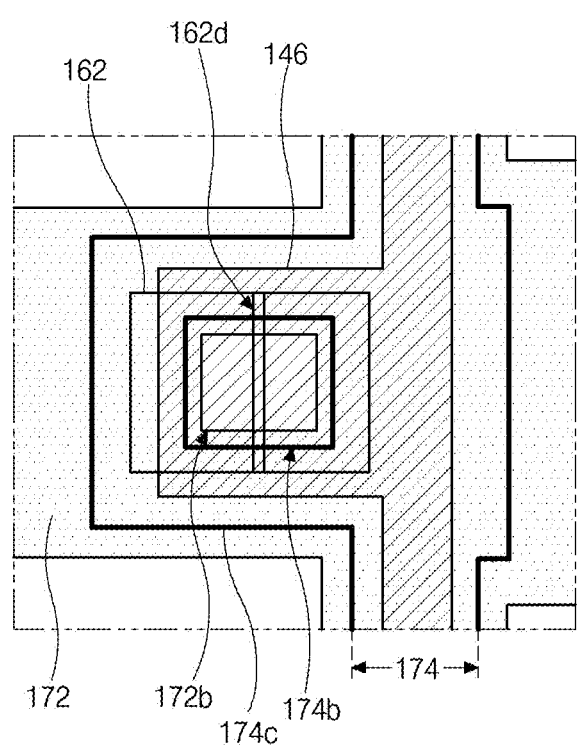

In FIG. 5, FIG. 6, and FIG. 7, one pixel of the electroluminescent display device according to the embodiment of the present disclosure includes red, green, and blue sub-pixels R, G and B sequentially arranged along a first direction.

Here, the red, green, and blue sub-pixels R, G and B may have different sizes. The sizes of the red, green, and blue sub-pixels R, G and B are determined by considering the lifetime of a light-emitting diode provided at each sub-pixel. For example, the size of the green sub-pixel G may be larger than the size of the red sub-pixel R and smaller than the size of the blue sub-pixel B.

The red, green, and blue sub-pixels R, G, and B can be defined by first and second banks 172 and 174.

More specifically, the first bank 172 is disposed between adjacent same color sub-pixels R, G and B and between adjacent different color sub-pixels R, G and B. The first bank 172 can surround each sub-pixel R, G and B.

Alternatively, the first bank 172 can be omitted between the adjacent different color sub-pixels R, G and B. That is, the first bank 172 can be formed only between the adjacent sub-pixels R, G and B along a second direction perpendicular to the first direction and can extend in the first direction.

Next, the second bank 174 is formed on the first bank 172. The second bank 174 has an opening 174a corresponding to a same color sub-pixel column and is disposed between adjacent different color sub-pixels R, G and B along the first direction.

The second bank 174 extends substantially in the second direction, and at least one side of the second bank 174 has an extension 174c extending in the first direction. At this time, the extension 174c can be disposed between the adjacent same color sub-pixels R, G and B along the second direction and can overlap the first bank 172. The extension 174c reduces a distance between adjacent portions of the second bank 174 and controls the flow of a solution during a solution process for forming a light-emitting layer, so that the light-emitting layer is uniformly formed.

The size of the extension 174c can vary according to the size of each sub-pixel R, G, and B.

Meanwhile, the first bank 172 and the second bank 174 have first and second auxiliary contact holes 172b and 174b corresponding to at least one extension 174c, respectively.

An auxiliary electrode 146 and a connection pattern 162 are formed to correspond to the extension 174c. The connection pattern 162 is exposed through the first and second auxiliary contact holes 172b and 174b.

In addition, although not shown in the figure, at least one insulation layer may be formed between the auxiliary electrode 146 and the connection pattern 162. The auxiliary electrode 146 and the connection pattern 162 are in contact with each other through a contact hole formed in the at least one insulation layer.

Meanwhile, the connection pattern 162 has at least one protrusion part 162d.

As shown in FIG. 6, the protrusion part 162d may have a dot shape. Alternatively, as shown in FIG. 7, the protrusion part 162d may have a slit shape having a width and a length different from each other. In this case, the length of the protrusion part 162d can be the same as a length of the connection pattern 162.

It is preferable that a diameter or the width of the protrusion part 162d is 2 μm to 4 μm.

Although it is illustrated that the protrusion part 162d is one, the number of the protrusion parts 162d is not limited thereto. Namely, a plurality of protrusion parts can be formed according to the size of the connection pattern 162 exposed through the first and second auxiliary contact holes 172b and 174b.

At this time, if the protrusion parts 162d are too many, defects can be caused due to particles. Accordingly, it is beneficial that the total size of the plurality of protrusion parts 162d is less than 5% of the size of the connection pattern 162 exposed through the first and second auxiliary contact holes 172b and 174b.

Meanwhile, although not shown in the figure, a second electrode 190 of FIGS. 3 and 4 is formed on the first and second banks 172 and 174 and the connection pattern 162, and the second electrode 190 is electrically connected to the auxiliary electrode 146 through the connection pattern 162.

A part of the light-emitting layer 180 of FIGS. 3 and 4 can be formed between the connection pattern 162 and the second electrode 190, and thus an electrical contact property between the connection pattern 162 and the second electrode 190 can be lowered. However, in the present disclosure, since the connection pattern 162 has the protrusion part 162d, a distance between the connection pattern 162 and the second electrode 190 decreases, and the electrical contact property between the connection pattern 162 and the second electrode 190 can be improved.

The configuration of the electroluminescent display device including the connection pattern 162 having the protrusion part 162d will be described in more detail with reference to FIG. 8.

Figure 8:
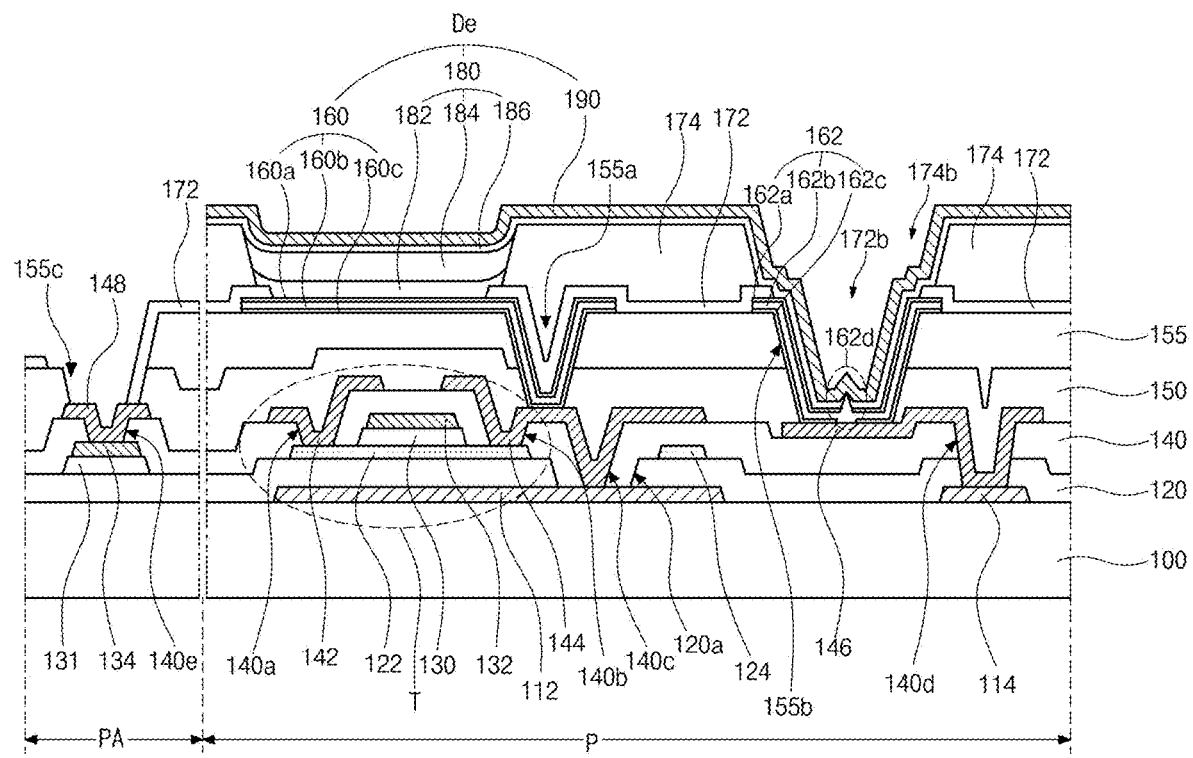
FIG. 8 is a schematic cross-sectional view of an electroluminescent display device according to an embodiment of the present disclosure.

FIG. 8 is a schematic cross-sectional view of an electroluminescent display device according to the embodiment of the present disclosure and shows a pixel region P and a pad region PA. The pixel region P is disposed in a display area displaying an image, and the pad region PA is disposed in a non-display area surrounding the display area.

In FIG. 8, a light-blocking pattern 112 and a first auxiliary electrode 114 of a first conductive material such as metal are formed in the pixel region P on a substrate 100. The substrate 100 may be a glass substrate or a plastic substrate. For example, polyimide may be used for the plastic substrate, but is not limited thereto.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

A buffer layer 120 is formed on the light-blocking pattern 112 and the first auxiliary electrode 114 substantially on an entire surface of the substrate 100. The buffer layer 120 can be formed of an inorganic insulating material such as silicon oxide ($SiO_2$) or silicon nitride (SiNx) and can be formed as a single layer or multi layers.

Here, the buffer layer 120 has a buffer hole 120a on the light-blocking pattern 112, and an upper surface of the light-blocking pattern 112 is partially exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, both ends of the semiconductor layer 122 and the capacitor electrode 124 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide ($SiO_2$) or silicon nitride (SiNx). When the semiconductor layer 122 is made of an oxide semiconductor material, it is preferable that the gate insulation layer 130 is formed of silicon oxide ($SiO_2$).

Alternatively, when the semiconductor layer 122 is made of polycrystalline silicon, the gate insulation layer 130 can be formed of silicon oxide ($SiO_2$) or silicon nitride (SiNx).

The gate electrode 132 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have the same shape as the gate electrode 132. At this time, a width of the gate insulation layer 130 can be larger than a width of the gate electrode 132, and thus, edges of an upper surface of the gate insulation layer 130 can be exposed. Alternatively, the width of the gate insulation layer 130 can be the same as the width of the gate electrode 132.

Or, the gate insulation layer 130 may not be patterned and can be formed substantially over the entire surface of the substrate 100.

Meanwhile, a gate line (not shown) can be further formed of the same material and on the same layer as the gate electrode 132.

In addition, a gate insulation pattern 131 and a first pad electrode 134 are sequentially formed on the buffer layer 120 in the pad region PA. The gate insulation pattern 131 can be formed of the same material as the gate insulation layer 130, and the first pad electrode 134 can be formed of the same material as the gate electrode 132. The gate insulation pattern 131 can be patterned to have the same shape as the first pad electrode 134. At this time, a width of the gate insulation pattern 131 can be larger than a width of the first pad electrode 134, and edges of an upper surface of the gate insulation pattern 131 can be exposed. Alternatively, the width of the gate insulation pattern 131 can be the same as the width of the first pad electrode 134.

An interlayer insulation layer 140 made of an insulating material is formed on the gate electrode 132 substantially over the entire surface of the substrate 100. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first, second, third and fourth contact holes 140a, 140b, 140c and 140d. The first and second contact holes 140a and 140b expose the both ends of the semiconductor layer 122. The third contact hole 140c partially exposes the upper surface of the light-blocking pattern 112 and is located in the buffer hole 120a. Alternatively, the buffer hole 120a may be omitted, and the third contact hole 140c can be formed in the buffer layer 120 as well as in the interlayer insulation layer 140 to partially expose the upper surface of the light-blocking pattern 112. The fourth contact hole 140d is formed in the buffer layer 120 as well as in the interlayer insulation layer 140 to partially expose an upper surface of the first auxiliary electrode 114.

The interlayer insulation layer 140 is also formed on the first pad electrode 134 in the pad region PA and has a fifth contact hole 140e partially exposing an upper surface of the first pad electrode 134.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 are spaced apart from each other with the gate electrode 132 positioned therebetween. The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140d.

In addition, a data line (not shown) and a high voltage supply line (not shown) can be further formed on the interlayer insulation layer 140 and can be made of the third conductive material.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T corresponds to a driving thin film transistor Td of FIG. 1, and a switching thin film transistor Ts of FIG. 1 having the same structure as the driving thin film transistor Td can be further formed on the substrate 100. The gate electrode 132 of the driving thin film transistor can be connected to a drain electrode of the switching thin film transistor, and the source electrode 142 of the driving thin film transistor is connected to the power supply line. In addition, a gate electrode and a source electrode of the switching thin film transistor can be connected to the gate line and the data line, respectively.

In addition, a second pad electrode 148 is formed on the interlayer insulation layer 140 in the pad region PA. The second pad electrode 148 is formed of the same material as the source and drain electrodes 142 and 144 and is in contact with the first pad electrode 134 through the fifth contact hole 140e.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to lower layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a sixth contact hole 155b exposing the second auxiliary electrode 146.

Meanwhile, the passivation layer 150 and the overcoat layer 155 are also formed in the pad region PA. The passivation layer 150 and the overcoat layer 155 of the pad region PA have a pad hole 155c exposing the second pad electrode 148. At this time, the overcoat layer 155 of the pad region PA is partially removed, thereby exposing the passivation layer 150 thereunder. Accordingly, the level difference between the layers formed on the second pad electrode 148 is lowered, and it is possible to facilitate contact with external circuit.

A first electrode 160 is formed on the overcoat layer 155 in the pixel region P and formed of a conductive material. The first electrode 160 is in contact with the drain electrode 144 through the drain contact hole 155a.

The first electrode 160 includes a first layer 160a and a second layer 160b, and the second layer 160b is disposed between the first layer 160a and the substrate 100, more particularly, between the first layer 160a and the overcoat layer 155.

The first layer 160a is formed of a conductive material having relatively high work function. For example, the first layer 160a can be formed of a transparent conductive material such as indium tin oxide (ITO) or indium zinc oxide (IZO). The second layer 160b is formed of a metal material having relatively high reflectance. For example, the second layer 160b can be formed of silver (Ag). Here, the work function of the first layer 160a is higher than the work function of the second layer 160b.

A thickness of the second layer 160b can be larger than a thickness of the first layer 160a. For example, the thickness of the second layer 160b can be 80 nm to 100 nm, and the thickness of the first layer 160a can be 10 nm to 80 nm. However, the present disclosure is not limited thereto.

In addition, the first electrode 160 can further include a third layer 160c between the second layer 160b and the substrate 100, for example, between the second layer 160*b* and the overcoat layer 155. The third layer 160*c* is formed to improve the adhesion property between the second layer 160*b* and the overcoat layer 155 and can be omitted. For example, the third layer 160*c* can be formed of a transparent conductive material such as ITO or IZO, but is not limited thereto.

A thickness of the third layer 160*c* can be smaller than the thickness of the second layer 160*b* and can be smaller than or equal to the thickness of the first layer 160*a*. For example, the thickness of the third layer 160*c* can be 10 nm, but is not limited thereto.

In addition, a connection pattern 162 is formed on the overcoat layer 155 and is formed of the same material as the first electrode 160. Accordingly, the connection pattern 162 can include first, second and third layers 162*a*, 162*b*, and 162*c*. At this time, the second layer 162*b* is disposed between the first layer 162*a* and the third layer 162*c*, and the third layer 162*c* is disposed between the second layer 162*b* and the substrate 100, more particularly, between the second layer 162*b* and the overcoat layer 155. The connection pattern 162 is in contact with the second auxiliary electrode 146 through the sixth contact hole 155*b*.

The connection pattern 162 includes at least one protrusion part 162*d* and a flat part in the sixth contact hole 155*b*. The flat part corresponds to a part excluding the protrusion part 162*d*. A height of the protrusion part 162*d* is higher than a height of the flat part.

Here, the first layer 162*a* and the third layer 162*c* of the connection pattern 162 have a hole corresponding to the protrusion part 162*d*. Accordingly, a lower surface of the second layer 162*b* can be in contact with the second auxiliary electrode 146 through the hole of the third layer 162*c*. In addition, an upper surface of the second layer 162*b* protrudes above through the hole of the first layer 162*a* to thereby form the protrusion part 162*d* of the connection pattern 162. That is, the second layer 162*b* of the connection pattern 162 has substantially the protrusion part 162*d*.

Meanwhile, as described above, when the third layer 160*c* of the first electrode 160 is omitted and the first electrode 160 is configured as double layers, the third layer 162*c* of the connection pattern 162 is also omitted.

A bank of an insulating material is formed on the first electrode 160. The bank includes a first bank 172 of a hydrophilic property and a second bank 174 of a hydrophobic property.

More particularly, the first bank 172 overlaps and covers edges of the first electrode 160 and exposes a central portion of the first electrode 160. In addition, the first bank 172 is also formed on the connection pattern 162 and overlaps and covers edges of the connection pattern 162. The first bank 172 has a first auxiliary contact hole 172*b* exposing a central portion of the connection pattern 162.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

Meanwhile, the first bank 172 can also be formed in the pad region PA. The bank 172 is removed to correspond to the pad hole 155*c*, thereby exposing the second pad electrode 148.

The second bank 174 is formed on the first bank 172. At this time, at least an upper surface of the second bank 174 is hydrophobic, and a side surface of the second bank 174 can be hydrophobic or hydrophilic.

The second bank 174 has an opening exposing the central portion of the first electrode 160. As described above, the opening of the second bank 174 can be formed to correspond to the same color sub-pixel column.

The second bank 174 is disposed on the first bank 172 with a narrower width than the first bank 172 and exposes edges of the first bank 172. In addition, a thickness of the second bank 174 can be larger than a thickness of the first bank 172.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 has a second auxiliary contact hole 174*b* corresponding to the first auxiliary contact hole 172*b*. The connection pattern 162 is exposed through the first and second auxiliary contact holes 172*b* and 174*b*.

The connection pattern 162 and the first and second auxiliary contact holes 172*b* and 174*b* can be omitted in some pixel regions.

Meanwhile, only the first bank 172 can be disposed on other edges of the first electrode 160 not shown in the figure.

In addition, the first bank 172 and the second bank 174 are formed of different materials and separated from each other in FIG. 8. However, the hydrophilic first bank 172 and the hydrophobic second bank 174 can be formed of the same material and formed as one body.

A light-emitting layer 180 is formed on the first electrode 160 exposed by the first and second banks 172 and 174. The light-emitting layer 180 can include a first charge auxiliary layer 182, a light-emitting material layer 184, and a second charge auxiliary layer 186 that are sequentially positioned over the first electrode 160. The light-emitting material layer 184 can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, the present disclosure is not limited thereto.

Here, each of the first charge auxiliary layer 182 and the light-emitting material layer 184 is formed through a solution process. Thus, the process can be simplified and a display device with a large size and high resolution can be provided. A spin coating method, an ink jet printing method, or a screen printing method can be used as the solution process, but the present disclosure is not limited thereto. When the solution is dried, a drying speed of a solvent in a region adjacent to the second bank 174 is different from that in other regions. That is, the drying speed of the solvent in the region adjacent to the second bank 174 is faster than that in the other regions. Therefore, a height of each of the first charge auxiliary layer 182 and the light-emitting material layer 184 in the region adjacent to the second bank 174 can rise as it gets closer to the second bank 174.

On the other hand, the second charge auxiliary layer 186 is formed through a thermal evaporation process. Accordingly, the second charge auxiliary layer 186 is formed substantially over the entire surface of the substrate 100.

That is, the second charge auxiliary layer 186 is formed on the upper surface and the side surface of the second bank 174 and is also formed on the connection pattern 162. At this time, the second charge auxiliary layer 186 has a relatively thin thickness on the protrusion part 162d of the connection pattern 162. Namely, the thickness of the second charge auxiliary layer 186 on the protrusion part 162d of the connection pattern 162 is smaller than the thickness of the second charge auxiliary layer 186 on the flat part of the connection pattern 162.

A second electrode 190 of a conductive material having a relatively low work function is formed on the light-emitting layer 180, the second bank 174, and the connection pattern 162 substantially over the entire surface of the substrate 100. The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm.

Alternatively, the second electrode 190 can be formed of a transparent conductive material such as indium-gallium-oxide (IGO) or IZO, but is not limited thereto.

The second electrode 190 is electrically connected to the connection pattern 162 through the first and second auxiliary contact holes 172b and 174b. At this time, a distance between the second electrode 190 and the protrusion part 162d of the connection pattern 162 is smaller than a distance between the second electrode 190 and the flat part of the connection pattern 162. Accordingly, the electrical contact property between the second electrode 190 and the connection pattern 162 can be improved due to the protrusion part 162d of the connection pattern 162. Here, the second electrode 190 can be in direct contact with the protrusion part 162d of the connection pattern 162.

The first electrode 160, the light-emitting layer 180 and the second electrode 190 constitute a light-emitting diode De. The first electrode 160 can serve as an anode, and the second electrode 190 can serve as a cathode, but is not limited thereto.

As described above, the electroluminescent display device according to the embodiment of the present disclosure can be a top emission type in which light from the light-emitting layer 180 of the light-emitting diode De is output toward a direction opposite the substrate 100, that is, output to the outside through the second electrode 190. The top emission type display device can have a wider emission area than a bottom emission type display device of the same size, to thereby improve luminance and reduce power consumption.

At this time, the light-emitting diode De of each pixel region P can have an element thickness for a micro-cavity effect corresponding to a wavelength of the emitted light, thereby increasing the light efficiency.

In the meantime, although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

As described above, in the electroluminescent display device according to the embodiment of the present disclosure, by forming some of the light-emitting layer 180 through the solution process, a mask is omitted to thereby reduce the manufacturing costs, and a display device with a large size and high definition can be implemented.

In addition, the electroluminescent display device according to the embodiment of the present disclosure is implemented as the top emission type, thereby improving the luminance and reducing the power consumption. Here, since the second electrode 190 is formed to have the relatively thin thickness in order to transmit light, the resistance of the second electrode 190 can be increased, but the resistance of the second electrode 190 can be lowered by connecting the second electrode 190 to the first and second auxiliary electrodes 114 and 146 through the connection pattern 162. At this time, by forming the protrusion part 162d in the connection pattern 162, the electrical contact property between the second electrode 190 and the connection pattern 162 can be improved.

A manufacturing process of an electroluminescent display device according to the embodiment of the present disclosure will be described in detail with reference to FIGS. 9A to 9H.

FIGS. 9A to 9H are cross-sectional views schematically illustrating a manufacturing process of an electroluminescent display device according to the embodiment of the present disclosure and show a pixel region P and a pad region PA. FIG. 10A and FIG. 10B are scanning electron microscope (SEM) pictures showing a hole and a protrusion part of a connection pattern according to the embodiment of the present disclosure.

Figure 9A:
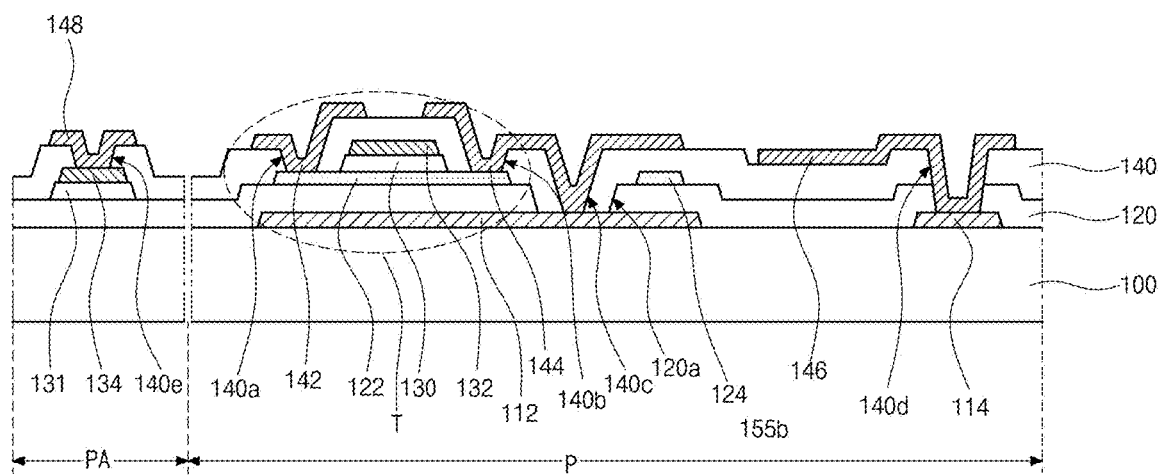
FIGS. 9A to 9H are cross-sectional views schematically illustrating a manufacturing process of an electroluminescent display device according to an embodiment of the present disclosure.
Figure 10A:
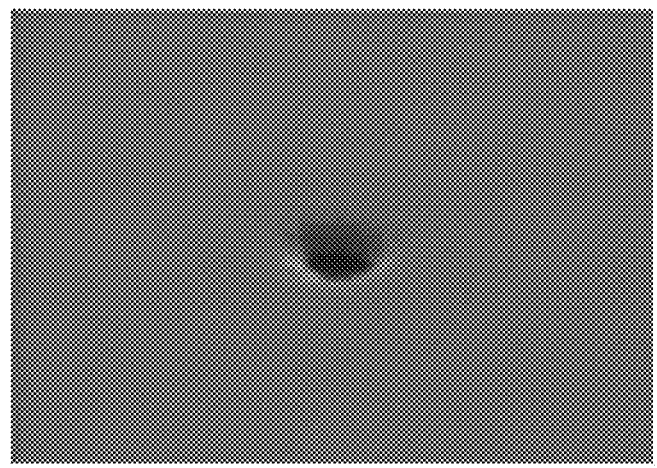
FIG. 10A and FIG. 10B are scanning electron microscope (SEM) pictures showing a hole and a protrusion part of a connection pattern according to an embodiment of the present disclosure.
Figure 10B:
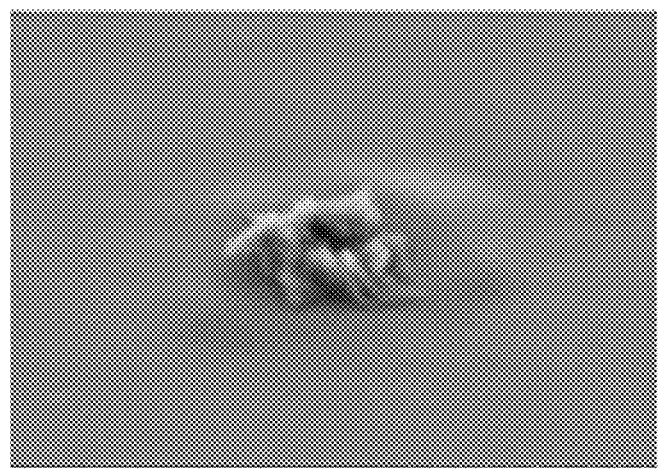

In FIG. 9A, a light-blocking pattern 112 and a first auxiliary electrode 114 are formed in a pixel region P on a substrate 100 on which the pixel region P and a pad region PA are defined by depositing a first conductive material and patterning it through a first mask process.

Next, a buffer layer 120 is formed on the light-blocking pattern 112 and the first auxiliary electrode 114 by depositing an inorganic insulating material substantially over an entire surface of the substrate 100 and is patterned through a second mask process, thereby forming a buffer hole 120a partially exposing an upper surface of the light-blocking pattern 112.

Then, a semiconductor layer 122 and a capacitor electrode 124 are formed on the buffer layer 120 by depositing a semiconductor material and patterning it through a third mask process. The semiconductor layer 122 and the capacitor electrode 124 are spaced apart from each other over the light-blocking pattern 112.

The semiconductor material can be polycrystalline silicon, and in this case, both ends of the semiconductor layer 122 and the capacitor electrode 124 can be doped with impurities later. Alternatively, the semiconductor material can be formed of an oxide semiconductor material.

A gate insulation layer 130 and a gate electrode 132 are formed by sequentially depositing an inorganic insulating material and a second conductive material on the semiconductor layer 122 and the capacitor electrode 124 and patterning them through a fourth mask process. The gate insulation layer 130 and the gate electrode 132 are disposed to correspond to a center of the semiconductor layer 122. In addition, a gate insulation pattern 131 and a first pad electrode 134 are formed on the buffer layer 120 in the pad region PA.

Then, an interlayer insulation layer 140 is formed on the gate electrode 132 and the first pad electrode 134 by depositing an inorganic insulating material or applying an organic insulating material substantially over the entire surface of the substrate 100 and is patterned through a fifth mask process, thereby forming first, second, third, fourth and fifth contact holes 140a, 140b, 140c, 140d, and 140e. At this time, the buffer layer 120 can also be selectively removed.

The first and second contact holes 140a and 140b expose the both ends of the semiconductor layer 122. The third contact hole 140c partially exposes the upper surface of the light-blocking pattern 112 corresponding to the buffer hole 120a. Here, the buffer hole 120a can be omitted, and the third contact hole 140c can be formed in the buffer layer 120 as well as in the interlayer insulation layer 140 to partially expose the upper surface of the light-blocking pattern 112. In this case, the second mask process is omitted. In addition, the fourth contact hole 140d is formed in the buffer layer 120 as well as in the interlayer insulation layer 140 to partially expose an upper surface of the first auxiliary electrode 114. The fifth contact hole 140e partially exposes an upper surface of the first pad electrode 134.

Next, source and drain electrodes 142 and 144 and a second auxiliary electrode 146 are formed on the interlayer insulation layer 140 by depositing a third conductive material and patterning it through a sixth mask process. In addition, a second pad electrode 148 is formed in the pad region PA.

The source and drain electrodes 142 and 144 are in contact with the both ends of the semiconductor layer 122 through the first and second contact holes 140a and 140b, respectively. Further, the drain electrode 144 is contacts the light-blocking pattern 112 through the third contact hole 140c and overlaps the capacitor electrode 124.

Meanwhile, the second auxiliary electrode 146 contacts the first auxiliary electrode 114 through the fourth contact hole 140d. In addition, the second pad electrode 148 contacts the first pad electrode 134 through the fifth contact hole 140e.

The semiconductor layer 122, the gate electrode 132, and the source and drain electrodes 142 and 144 form a thin film transistor T. The capacitor electrode 124 overlaps the light-blocking pattern 112 and the drain electrode 144 to form a storage capacitor.

Figure 9B:
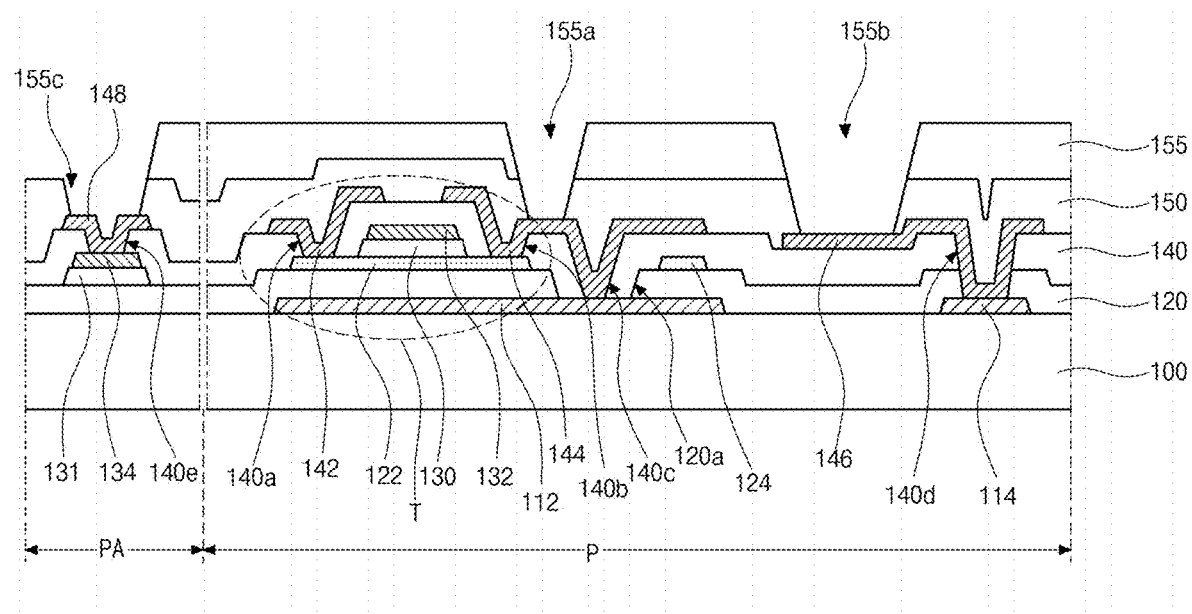

Next, in FIG. 9B, a passivation layer 150 is formed on the source and drain electrodes 142 and 144, the second auxiliary electrode 146 and the second pad electrode 148 by depositing an inorganic insulating material, and an overcoat layer 155 is formed on the passivation layer 150 by applying an organic insulating material. Then, the passivation layer 150 and the overcoat layer 155 are patterned through a seventh mask process, thereby forming a drain contact hole 155a, a sixth contact hole 155b and a pad hole 155c.

The drain contact hole 155a partially exposes the drain electrode 144, the sixth contact hole 155b exposes the second auxiliary electrode 146, and the pad hole 155c exposes the second pad electrode 148.

Here, it is described that the passivation layer 150 and the overcoat layer 155 are patterned through the same mask process, but the passivation layer 150 and the overcoat layer 155 can be patterned through different mask processes. That is, after the passivation layer 150 can be formed by depositing an inorganic insulating material and can be patterned through a mask process, the overcoat layer 155 can be formed by applying an organic insulating material and can be patterned through another mask process.

Figure 9C:
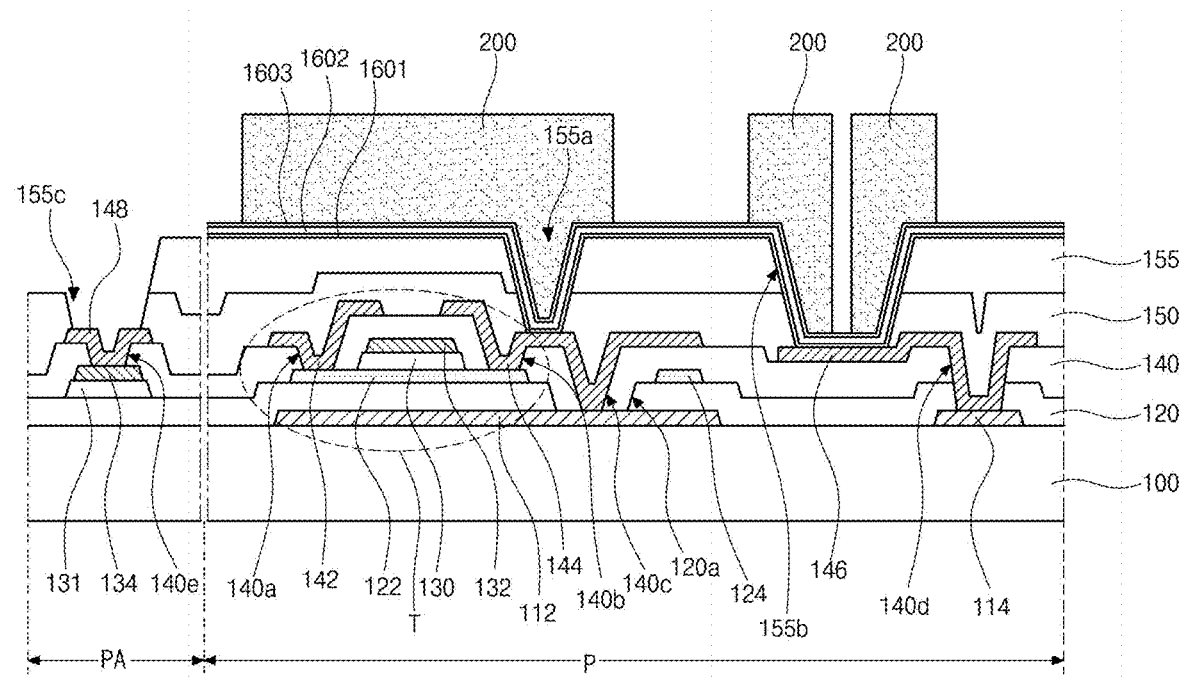
Figure 9D:
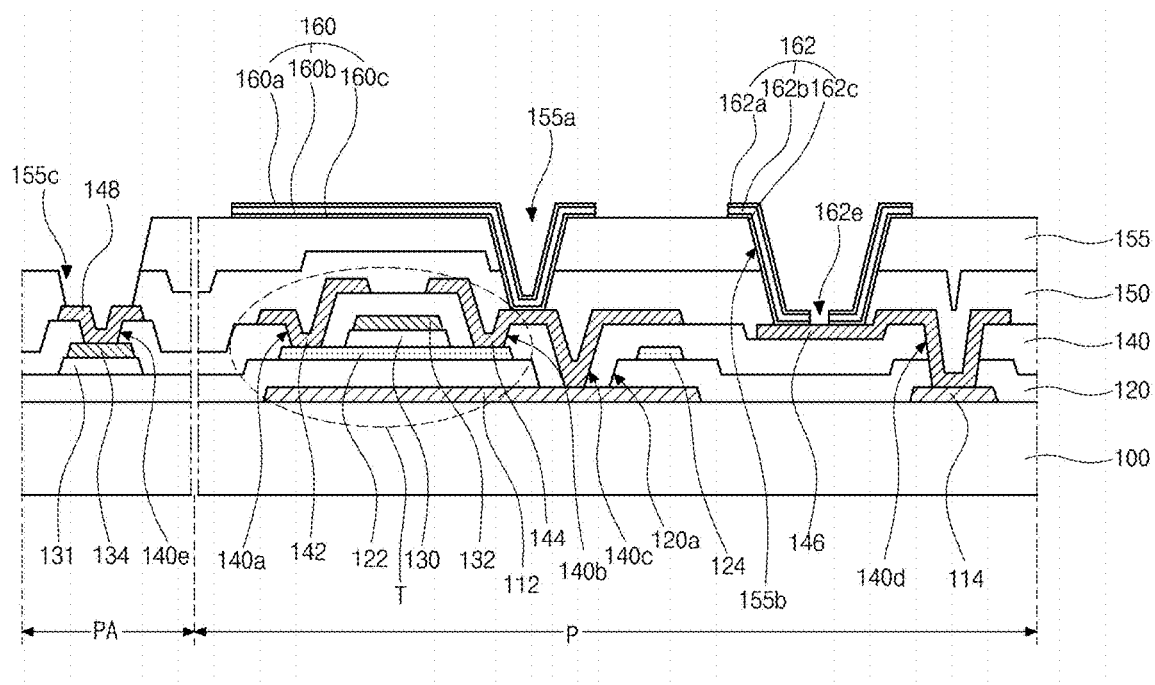

Next, as shown in FIGS. 9C and 9D, a first electrode 160 and a connection pattern 162 are formed on the overcoat layer 155 through an eighth mask process.

First, in FIG. 9C, a first conductive layer 1601, a second conductive layer 1602, and a third conductive layer 1603 are sequentially deposited on the overcoat layer 155 substantially over the entire surface of the substrate 100. Here, the second conductive layer 1602 is formed of silver (Ag). In addition, the first and third conductive layers 1601 and 1063 can be formed of ITO or IZO, but is not limited thereto.

Then, a photoresist pattern 200 is formed on the third conductive layer 1603. The photoresist pattern 200 is formed on the thin film transistor T and the second auxiliary electrode 146 and overlaps the drain contact hole 155a and the sixth contact hole 155b. Meanwhile, the photoresist pattern 200 corresponding to the sixth contact hole 155b partially exposes an upper surface of the third conductive layer 1603.

Next, the exposed first, second, and third conductive layers 1601, 1602, and 1603 are removed by using the photoresist pattern 200 as an etching mask. At this time, the first, second, and third conductive layers 1601, 1602, and 1603 can be removed by a wet etching method using a batch etchant. Alternatively, the first, second and third conductive layers 1601, 1602 and 1603 can be removed using different etchants. Then, the photoresist pattern 200 is removed.

Accordingly, as shown in FIG. 9D, the first electrode 160 and the connection pattern 162 are formed on the overcoat layer 155. Each of the first electrode 160 and the connection pattern 162 includes a first layer 160a and 162a, a second layer 160b and 162b, and a third layer 160c and 162c. The second layer 160b and 162b is disposed between the first layer 160a and 162a and the third layer 160c and 162c, and the third layer 160c and 162c is disposed between the second layer 160b and 162b and the overcoat layer 155. The first layer 160a and 162a corresponds to the third conductive layer 1603 of FIG. 9C, the second layer 160b and 162b corresponds to the second conductive layer 1602 of FIG. 9C, and the third layer 160c and 162c corresponds to the first conductive layer 1601 of FIG. 9C.

Here, the first electrode 160 is in contact with the drain electrode 144 through the drain contact hole 155a, and the connection pattern 162 is in contact with the second auxiliary electrode 146 through the sixth contact hole 155b.

Meanwhile, the connection pattern 162 includes at least one hole 162e in the sixth contact hole 155b, and an upper surface of the second auxiliary electrode 146 is partially exposed through the hole 162e. FIG. 10A is an SEM picture showing the hole 162e.

Figure 9E:
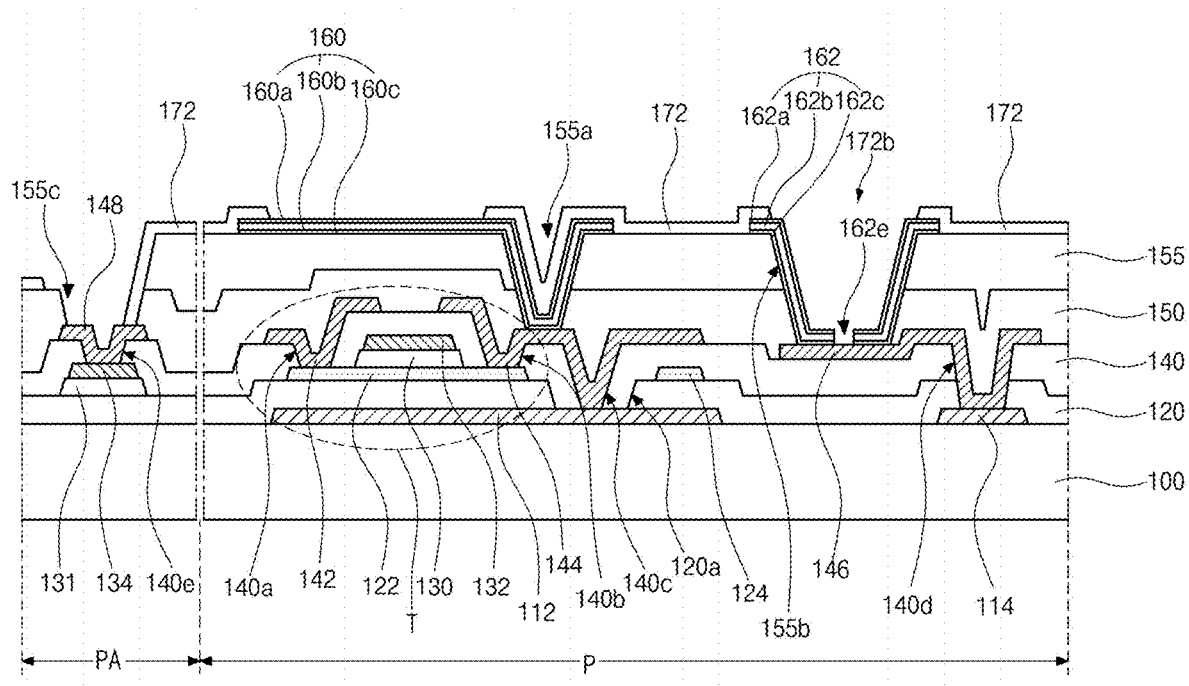

Next, in FIG. 9E, a first bank 172 of a hydrophilic property is formed on the first electrode 160 and the connection pattern 162 by depositing an insulating material and patterning it through a ninth mask process. The first bank 172 overlaps and covers edges of the first electrode 160 and exposes a central portion of the first electrode 160. In addition, the first bank 172 overlaps and covers edges of the connection pattern 162. The first bank 172 has a first auxiliary contact hole 172b exposing a central portion of the connection pattern 162.

Meanwhile, the first bank 172 is removed to correspond to the pad hole 155c, thereby exposing the second pad electrode 148.

Figure 9F:
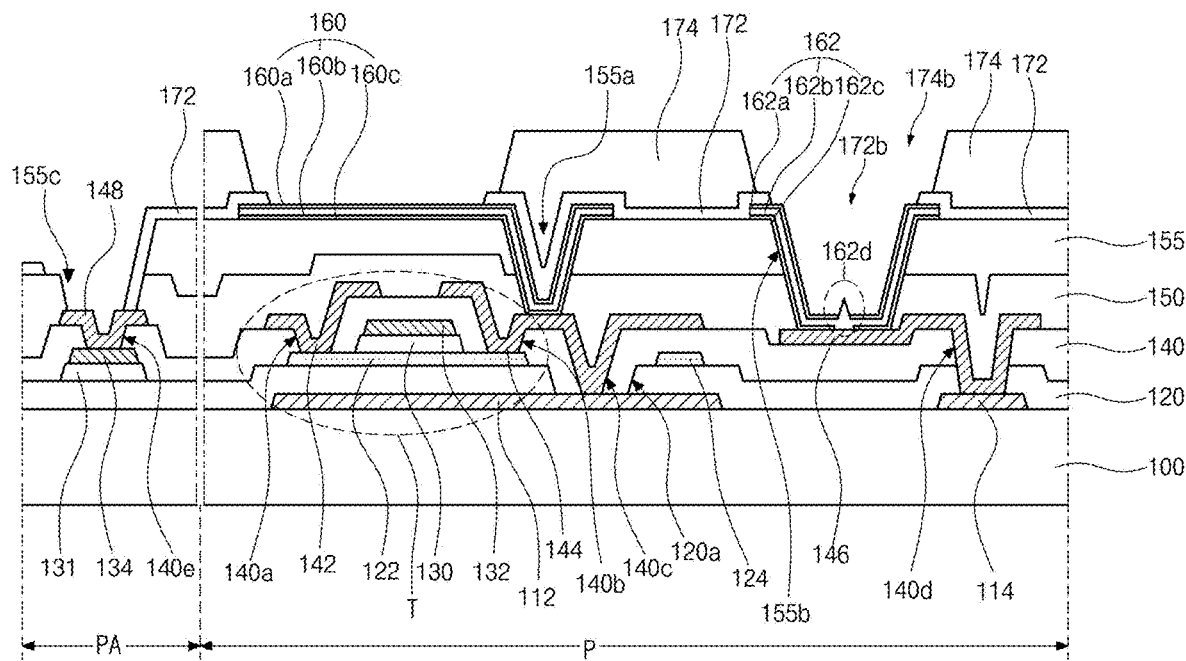

Next, in FIG. 9F, a second bank 174 of a hydrophobic property is formed on the first bank 172 by applying an organic material and patterning it through a tenth mask process.

More particularly, after a bank material layer (not shown) is formed by applying an organic material, a photomask (not shown) is disposed over the bank material layer, and the bank material is exposed to light through the photomask. At this time, the bank material layer can be a negative photosensitive type in which a portion exposed to light remains after developing. Then, the bank material layer exposed to light is developed and a portion not exposed to light is removed, thereby forming the second bank 174. However, the present disclosure is not limited thereto, and the bank material layer can be a positive photosensitive type in which a portion not exposed to light remains after developing.

Next, the second bank 174 is baked. At this time, the second bank 174 can be baked by heating the substrate 100 on which the second bank 174 is formed in an oven at about 230 degrees Celsius for about an hour.

Meanwhile, a migration phenomenon in a material of the second layer 162b of the connection pattern 162 occurs due to the heat generated when the second bank 174 is baked. Accordingly, the material of the second layer 162b is migrated and protrudes above the hole 162e of FIG. 9E, thereby forming a protrusion part 162d. FIG. 10B is an SEM picture showing the protrusion part 162d.

In the present disclosure, it is described that the hydrophilic first bank 172 and the hydrophobic second bank 174 are formed through different mask processes, but the first bank 172 and the second bank 174 can be formed through the same mask process. For example, after an organic material layer can be formed substantially over the entire surface of the substrate 100, the organic material layer can be exposed to light using a halftone mask, which includes a light-transmitting portion, a light-blocking portion and a half light-transmitting portion, and can be patterned, thereby forming the hydrophilic first bank 172 and the hydrophobic second bank 174.

Figure 9G:
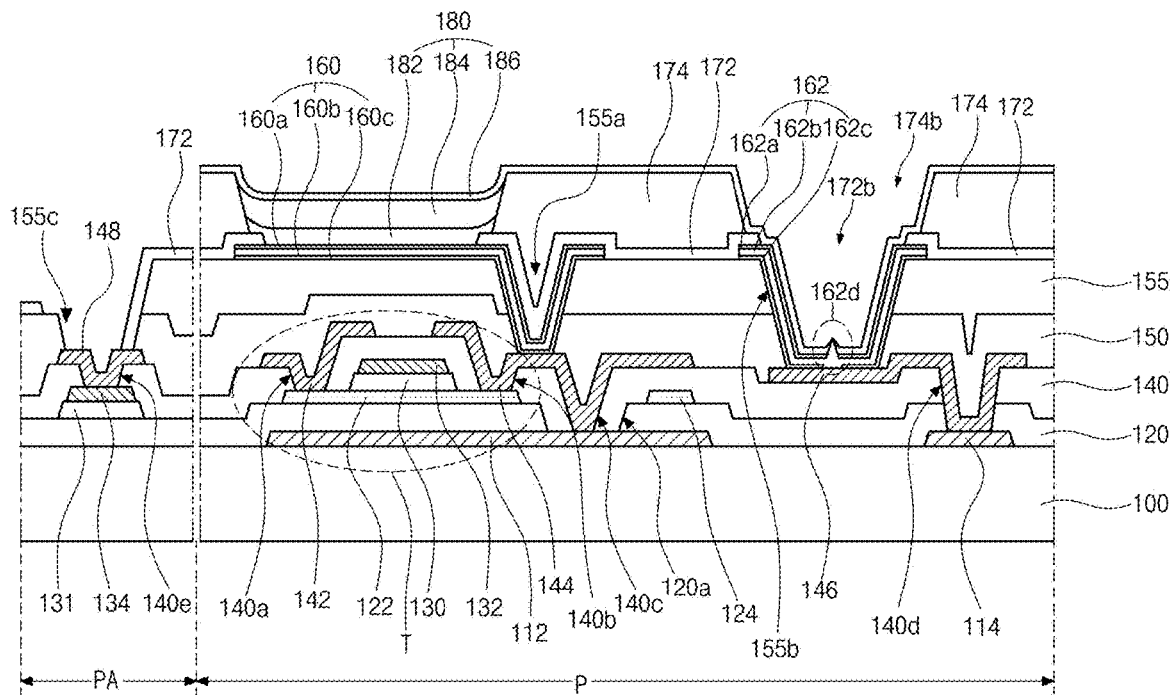

Next, in FIG. 9G, a first charge auxiliary layer 182 is formed on the first electrode 160 exposed through the second bank 174 by dropping a first solution and drying it. At least one side surface of the first charge auxiliary layer 182 is enclosed by the second bank 174. When the first solution is dried, a drying speed of a solvent in a region adjacent to the second bank 174 is different from that in other regions, and thus a height of the first charge auxiliary layer 182 in the region adjacent to the second bank 174 rises as it gets closer to the second bank 174.

The first charge auxiliary layer 182 can be a hole injecting layer (HIL) and/or a hole transporting layer (HTL).

Then, a light-emitting material layer 184 is formed on the first charge auxiliary layer 182 by dropping a second solution and drying it. At least one side surface of the light-emitting material layer 184 is enclosed by the second bank 174. When the second solution is dried, a drying speed of a solvent in a region adjacent to the second bank 174 is different from that in other regions, and thus a height of the light-emitting material layer 184 in the region adjacent to the second bank 174 rises as it gets closer to the second bank 174.

Next, a second charge auxiliary layer 186 is formed on the light-emitting material layer 184 by depositing an organic material and/or an inorganic material. The second charge auxiliary layer 186 is formed substantially over the entire surface of the substrate 100. Accordingly, the second charge auxiliary layer 186 is also formed on the second bank 174 and the connection pattern 162.

At this time, the second charge auxiliary layer 186 has a relatively thin thickness on the protrusion part 162d of the connection pattern 162. The second charge auxiliary layer 186 can have a hole (not shown) exposing the protrusion part 162d.

The second charge auxiliary layer 186 can be an electron injecting layer (EIL) and/or an electron transporting layer (ETL).

The first charge auxiliary layer 182, the light-emitting material layer 184 and the second charge auxiliary layer 186 constitute a light-emitting layer 180.

Figure 9H:
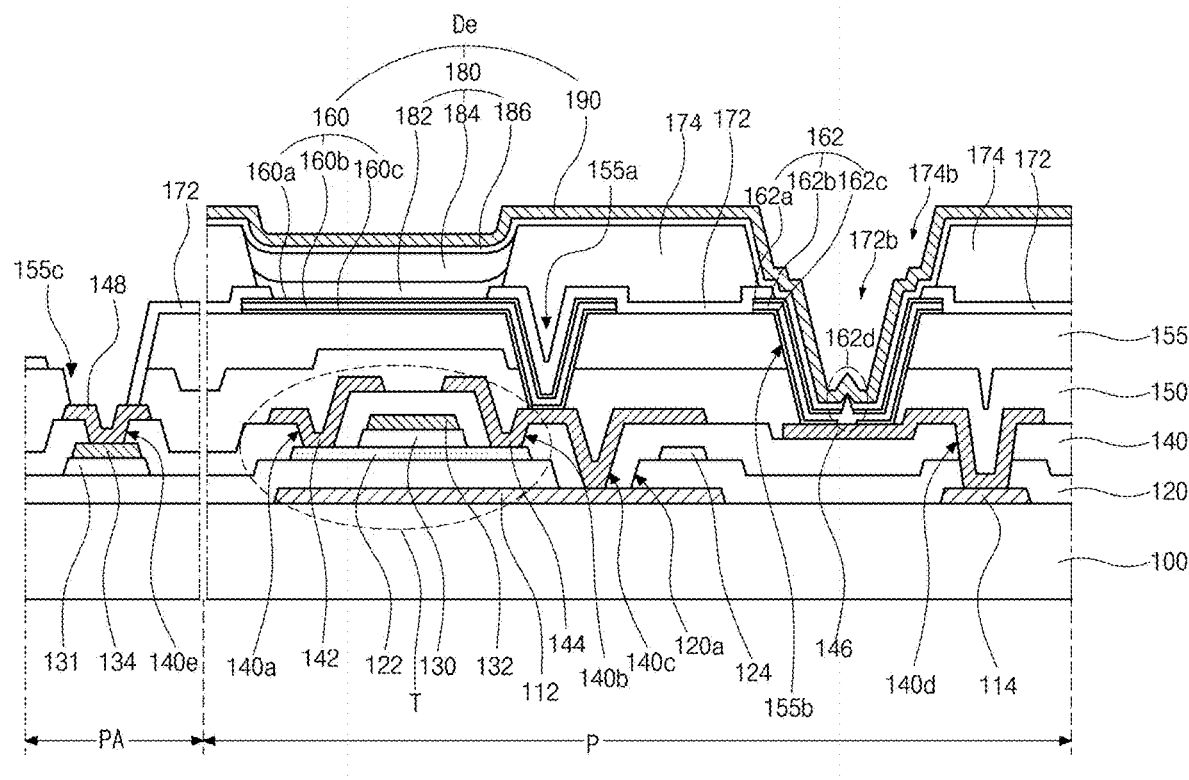

Next, in FIG. 9H, a second electrode 190 is formed on the second charge auxiliary layer 186 by depositing a conductive material such as metal. The second electrode 190 is formed substantially over the entire surface. Accordingly, the second electrode 190 is also formed over the second bank 174 and the connection pattern 162.

The second electrode 190 is electrically connected to the connection pattern 162 through the first and second auxiliary contact holes 172b and 174b. At this time, the second charge auxiliary layer 186 is disposed between the second electrode 190 and the connection pattern 162, and a distance between the second electrode 190 and the protrusion part 162d of the connection pattern 162 is smaller than a distance between the second electrode 190 and a flat part of the connection pattern 162 because the second charge auxiliary layer 186 has the relatively thin thickness on the protrusion part 162d of the connection pattern 162 due the protrusion part 162d. Accordingly, the electrical contact property between the second electrode 190 and the connection pattern 162 can be improved due to the protrusion part 162d of the connection pattern 162. Here, the second electrode 190 can be in direct contact with the protrusion part 162d of the connection pattern 162.

The first electrode 160, the light-emitting layer 180 and the second electrode 190 constitute a light-emitting diode De. The first electrode 160 can serve as an anode, and the second electrode 190 can serve as a cathode.

As described above, in the electroluminescent display device according to the embodiment of the present disclosure, when the first electrode 160 and the connection pattern 162 are formed, the hole 162e of FIG. 9E is formed in the connection pattern 162, and when the second bank 174 is baked, the protrusion part 162d is formed in the connection pattern 162 through the migration phenomenon. Accordingly, by electrically connecting the second electrode 190 and the first and second auxiliary electrodes 114 and 146 through the connection pattern 162 having the protrusion part 162d, the electrical contact property between the second electrode 190 and the connection pattern 162 can be improved without increasing the process.

Namely, the thickness of the second charge auxiliary layer 186 on the protrusion part 162d of the connection pattern 162 is smaller than the thickness of the second charge auxiliary layer 186 on the flat part of the connection pattern 162.

In the present disclosure, by forming the light-emitting layer of each sub-pixel through the solution process, a mask is omitted to thereby reduce the manufacturing costs, and a display device with a large size and high definition can be implemented.

In addition, the light-emitting layers in pixel regions adjacent along one direction, for example, of the same color sub-pixels are connected to each other and formed as one body, thereby reducing or minimizing the deviation in the dropping amount between nozzles and uniformly forming the thicknesses of the light-emitting layers of the sub-pixels.

Therefore, the mura is prevented, thereby effectively preventing the image quality of the display device from being lowered.

Moreover, the second electrode is connected to the auxiliary electrode, thereby lowering the resistance of the second electrode, and the protrusion part is formed in the connection pattern for connecting the second electrode and the auxiliary electrode, thereby improving the electrical contact property between the second electrode and the connection pattern.

It will be apparent to those skilled in the art that various modifications and variations can be made in a device of the present disclosure without departing from the sprit or scope of the embodiment. Thus, it is intended that the present disclosure covers the modifications and variations of this disclosure provided they come within the scope of the appended claims and their equivalents.

What is claimed is:

1. An electroluminescent display device comprising:
   a substrate;
   a first electrode on the substrate;
   a connection pattern on the substrate and spaced apart from the first electrode;
   a bank covering edges of the first electrode and the connection pattern;
   a light-emitting layer on the first electrode; and
   a second electrode on the light-emitting layer, the bank, and the connection pattern,
   wherein the connection pattern includes at least one protrusion part and a flat part, and
   wherein each of the first electrode and the connection pattern includes a first layer and a second layer, the second layer is disposed between the substrate and the first layer, and the second layer of the connection pattern has the at least one protrusion part.

2. The electroluminescent display device of claim 1, wherein the second electrode is in direct contact with the at least one protrusion part.

3. The electroluminescent display device of claim 1, wherein a distance between the second electrode and the at least one protrusion part is smaller than a distance between the second electrode and the flat part.

4. The electroluminescent display device of claim 1, wherein the first layer of the connection pattern has a hole corresponding to the protrusion part.

5. The electroluminescent display device of claim 4, wherein the hole has a dot shape or a slit shape.

6. The electroluminescent display device of claim 1, wherein a work function of the first layer is higher than a work function of the second layer.

7. The electroluminescent display device of claim 6, wherein the second layer is formed of silver.

8. The electroluminescent display device of claim 1, wherein each of the first electrode and the connection pattern further includes a third layer between the second layer and the substrate.

9. The electroluminescent display device of claim 1, wherein the light-emitting layer includes a hole auxiliary layer, a light-emitting material layer, and an electron auxiliary layer, at least one side surface of each of the hole auxiliary layer and the light-emitting material layer is enclosed by the bank, and a part of the electron auxiliary layer is disposed between the bank and the second electrode and between the connection pattern and the second electrode.

10. The electroluminescent display device of claim 1, further comprising at least one thin film transistor between the substrate and the first electrode, wherein the first electrode is connected to the at least one thin film transistor.

11. The electroluminescent display device of claim 1, wherein the bank includes a first bank of a hydrophilic property and a second bank of a hydrophobic property.

12. The electroluminescent display device of claim 11, wherein the first bank and the second bank are formed as one body.

13. The electroluminescent display device of claim 11, wherein the light-emitting layer in a pixel region and a light-emitting layer in another pixel region adjacent thereto along one direction are connected to each other to thereby form one body.

14. A method of manufacturing an electroluminescent display device, comprising:
   forming a first electrode and a connection pattern on a substrate;
   forming a bank on the first electrode and the connection pattern;
   forming a light-emitting layer on the first electrode; and
   forming a second electrode on the light-emitting layer, the bank, and the connection pattern,
   wherein the connection pattern includes at least one protrusion part and a flat part, and
   wherein each of the first electrode and the connection pattern includes a first layer and a second layer, the second layer is disposed between the substrate and the first layer, and the second layer of the connection pattern has the at least one protrusion part.

15. The method of claim 14, wherein forming the first electrode and the connection pattern includes forming at least one hole in the connection pattern, and
   wherein forming the bank includes forming the at least one protrusion part by migrating a material of the connection pattern through the at least one hole.

16. The method of claim 14, wherein a distance between the second electrode and the at least one protrusion part is smaller than a distance between the second electrode and the flat part.

* * * * *